(12) United States Patent
Tian et al.

(10) Patent No.: US 6,303,518 B1
(45) Date of Patent: Oct. 16, 2001

(54) METHODS TO IMPROVE CHEMICAL VAPOR DEPOSITED FLUOROSILICATE GLASS (FSG) FILM ADHESION TO METAL BARRIER OR ETCH STOP/DIFFUSION BARRIER LAYERS

(75) Inventors: Jason L. Tian, Milpitas; M. Ziaul Karim, San Jose; Bart J. van Schravendijk, Sunnyvale, all of CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/409,580

(22) Filed: Sep. 30, 1999

(51) Int. Cl.⁷ .................................................. H01L 21/469
(52) U.S. Cl. ............................................ 438/758; 438/513
(58) Field of Search .................................. 438/778, 787, 438/791, 785, 758, 513, 714, 783, 637

(56) References Cited
U.S. PATENT DOCUMENTS

| | | | |
|---|---|---|---|
| 5,736,457 | 4/1998 | Zhao ..................................... | 438/624 |
| 5,759,906 | 6/1998 | Lou ...................................... | 438/623 |
| 5,876,838 | 3/1999 | Mallon ................................. | 428/195 |
| 5,900,290 | 5/1999 | Yang et al. .......................... | 427/577 |
| 6,070,550 | * 6/2000 | Ravi et al. ....................... | 118/723 E |
| 6,103,601 | * 8/2000 | Lee et al. ............................. | 438/513 |
| 6,107,192 | * 8/2000 | Subrahmanyan et al. ........... | 438/637 |

* cited by examiner

Primary Examiner—David Nelms
Assistant Examiner—David Vu
(74) Attorney, Agent, or Firm—Skjerven Morrill MacPherson LLP; Theodore P. Lopez

(57) ABSTRACT

An improved CVD process, preferably a PECVD process, for forming a low-dielectric-constant insulating material on a semiconductor substrate, or on and/or under a metal barrier, or etch stop layer of SiNx, Ta(N), TiN, WNx and others. Specifically, the improved PECVD process provides for deposition of an $N_2O+SiF_4+SiH_4$ based FSG film having improved characteristics, which may be accomplished in any conventional PECVD chamber, but preferably in a dual frequency PECVD chamber.

31 Claims, 3 Drawing Sheets

METHODS TO IMPROVE CHEMICAL VAPOR DEPOSITED FLUOROSILICATE GLASS (FSG) FILM ADHESION TO METAL BARRIER OR ETCH STOP/DIFFUSION BARRIER LAYERS

BACKGROUND OF THE INVENTION

1. Field of the Invention:

The present invention is related to a method of forming a dielectric of the type used in semiconductor damascene applications, and more particularly to an improved process for forming a low-dielectric-constant interface layer having improved characteristics.

2. Description of the Background:

Manufacturers of integrated circuits (ICs) continue to make ever-smaller devices, which allow for greater speed, but require increased device packing densities. The resulting increase in packing densities on a semiconductor chip, and the associated increase in functionality and complexity, require features which are smaller, more complex, and more closely-spaced.

As IC feature sizes are made smaller, for example to 0.25 microns and below, problems, such as misaligned or "unlanded" vias, increased resistance, and resistance-capacitance (RC) coupling, seem unavoidable. For example, as features become small and more closely-spaced, RC delays become an increasing part of total signal delays, offsetting any speed advantage derived from the smaller device size. RC delays thus limit improvement in device performance. One way to improve device performance and reliability would be to lower the resistivity using highly conductive metals, such as copper. Of importance to the present invention is the improvement of device performance and reliability by way of reducing capacitance, for example, by employing lower dielectric constant (low-k) materials.

Since capacitance is directly proportional to the dielectric constant (k), RC problems in ICs, can be reduced if a low-dielectric-constant material is used as the insulating material. The need for lower dielectric constant materials for use as intermetal and interlevel dielectrics for modern semiconductor technology is well known in the semiconductor industry. For example, silicon dioxide ($SiO_2$), has long been used as a dielectric for integrated circuits because of its excellent thermal stability and relatively good dielectric properties (k~4.0). However, the need exists for a dielectric material which is suitable for use in ICs which has a lower dielectric constant than $SiO_2$. After extensive study, a very promising dielectric material has been identified, known as Fluorosilicate Glass (FSG), which has a dielectric constant (k) of less than 3.7.

Many processes are known for depositing FSG thin film layers for damascene applications. One of the most important advantages of FSG is the simplicity with which it may be deposited, especially with CVD processes. As shown in FIG. 1, the process 10 begins with the in-situ deposition 12 of the reactants in a reaction deposition chamber. After an optional, yet, conventional SiN deposition 14, the reactant gas, containing reactants, such as $N_2O$, $SiF_4$ and $SiH_4$, are introduced into the chamber through an inlet port and arc excited to create ions or radicals by a high electric field created by an RF voltage. The electric field causes the inlet gas to become excited enough to form a glow discharge or plasma. When a plasma is used to generate the ions or radicals that recombine to give the desired film, the process is plasma-enhanced (PECVD). Plasma enhanced deposition 16 occurs when the molecules of the incoming gases are broken up in the plasma and the appropriate ions are recombined on the substrate surfaces to give the desired FSG film.

Next, an optional hardmask deposition 18 is applied to the structure, which is subsequently etched 20, or similarly cut, to create the desired pattern required for semiconductor applications. At this stage in the conventional process, a layered structure 30, similar to that shown in FIGS. 2A or 2B, has been developed. Next, the structure is degassed 22 and a metal barrier layer is deposited 22 followed by metal deposition 24, planarization 26, and final clean 28. Unfortunately, the structure formed using the conventional technique 10, is subject to many drawbacks. Generally, the degassing 22 typically fails to remove free fluorine ions which are a by-product in the film of the PECVD process. The film in this stage is considered chemically unstable. Moreover, FSG film tends to absorb $H_2O$. The presence of free fluorine ions and hydrogen may lead to the eventual formation of HF gas, which tends to degrade adhesion properties of the FSG. For example, after the application of the metal barrier layer, any HF gas that may form may not be able to diffuse out, which usually leads to blistering and bubbling of the metal and etch stop layers. Moreover, most methods used for FSG film deposition are not practical to use because of their unstable or higher cost of ownership (CoO).

For these reasons, what is needed is an improved process for depositing a robust FSG film on a substrate, metal barrier, or etch stop layer, such that the FSG film exhibits, for example, improved chemical stability, deposition rate, uniformity of thickness, and adhesion characteristics.

SUMMARY OF THE INVENTION

The present invention is an improved method of depositing a dielectric of the type used in damascene applications, where in-laid conductors are formed in the dielectric layer. More particularly, the present invention is an improved CVD process, preferably a PECVD process, for forming a low-dielectric-constant insulating material on a semiconductor substrate, or on and/or under a metal barrier or etch stop layer of SiNx, Ta(N), TiN, WNx and others. Specifically, the improved PECVD process provides for deposition of an $N_2O+SiF_4+SiH_4$ based FSG film having improved characteristics, which may be accomplished in any conventional PECVD chamber, but preferably in a dual frequency PECVD chamber. The dual frequency chamber may have both high and low frequency RF power, used to ignite and sustain the plasma.

The improved PECVD process of the present invention includes the addition of $N_2$ to the chemical reactants $N_2O+SiF_4+SiH_4$, in forming the FSG to be deposited on the surface of the substrate. As described in more detail below, by adding $N_2$ to the reaction in the PECVD, the reaction is more controllable. Control of the reactions leads to improved adhesion between the FSG film and other layers, such as etch and metal barrier layers of SiNx, Ta(N), TiN, WNx, and others. The improved controllability also improves the film thickness uniformity and the deposition rate of the deposited layer. It has also been advantageously determined that the addition of nitrogen atoms in the reaction increases the number of Si-N bonds formed within the FSG film, which makes the FSG film less susceptible to water absorption.

During the deposition process free radicals and ions of hydrogen (H), oxygen (O), and flourine (F) are formed into the film network, which may form weak and dangling bonds with Si or Si—O. Advantageously, another improvement to the process occurs after completion of the deposition process. The FSG thin film layer may be exposed to, and allowed to react with, $H_2O$. The length of the exposure may vary, and may range from minutes, to hours, to days. The FSG may then be annealed in a non-oxidizing atmosphere, such as in nitrogen, argon, or the like. The anneal provides important improvements to the process of the present invention. For example, the anneal provides the energy necessary for the $H_2O$ to attack the weak and dangling bonds, formed by the free ions during the deposition and $H_2O$ exposure. The anneal, described in more detail below, may be described as two heat treatments to the FSG film. The first heat treatment primarily breaks the weak bonds and diffuses out free F, H, O, and $H_2O$ and hydrogen near the surface of the FSG film. As mentioned above, it may not be desirable to have free F within the film, however; it is also not desirable for F within the film to be depleted. Thus, the second heat treatment primarily provides a bonding energy interior of the FSG film to bond remaining free F and Si, so that F levels are maintained within the FSG film. As one may appreciate, the first heat treatment may provide at least some of the benefit of the second heat treatment and vice versa.

Free F ions may be removed from the FSG film using a hydrogen plasma treatment in accordance with the principles of the present invention. In this aspect, after the in situ deposition of the FSG is complete, but prior to deposition of the etch and metal barrier layers of SiNx, Ta(N), TiN, WNx, and others, a hydrogen-based plasma is formed directly over the FSG surface. The plasma may be any hydrogen-based chemical, preferably $H_2$ or $NH_3$, formed from either the PECVD, High Density Plasma (HDP), or other plasma source. In operation, the hydrogen plasma captures free F ions at the surface of the FSG and reacts with the free F ions to form an HF gas. The HF as may then be readily removed from the chamber. Advantageously, the plasma treatment may be conducted while the substrate is heated so that F ions from within the body of the substrate may continue to be released therefrom.

In one aspect of the present invention, a process is provided for depositing a dielectric material, having improved characteristics, on a substrate. The process includes reacting vapor-phase chemicals in a chamber with sufficiently supplied energy to deposit a thin film layer on a substrate positioned in the chamber; exposing the thin film layer to moisture; and annealing the thin film layer for a time and at a temperature sufficient to allow the moisture to react with the thin film layer to diffuse out a chemical element from the thin film layer.

In yet another aspect of the present invention, a process is provided for forming a low dielectric constant material with improved characteristics on a substrate to form a thin film layer. The process includes exposing the thin film layer to moisture; heat treating the thin film layer in the presence of a non-oxidizing atmosphere at a first temperature for a first time duration, such that the first temperature and the first time duration are sufficient to diffuse out at least one element from the thin film layer; and heat treating the thin film layer in the presence of a process atmosphere at a second temperature for a second time duration for providing a bonding energy to the thin film layer.

In yet another aspect of the present invention, a process is provided for depositing a dielectric material, having improved characteristics, on a substrate. The process includes reacting vapor-phase chemicals in a chamber with sufficiently Supplied energy to deposit a thin film layer on a substrate positioned in the chamber; exposing the thin film layer to water; treating the thin film in a high density plasma environment; and annealing the thin film layer for a time and at a temperature sufficient to allow the water to react with the thin film layer to diffuse out a chemical element from the thin film layer.

DESCRIPTION OF THE PREFERRED EMBODIMENTS

Embodiments of the present invention will be described with reference to the aforementioned figures. These figures have been simplified for ease of understanding and describing the embodiments.

Referring generally to the figures, the present invention provides a process for depositing a low-dielectric-constant material on a silicon substrate, metal barrier, and/or etch stop layer, which is suitable for use between and around the conductive lines, vias, and other conductors in damascene structures.

Figure 3:
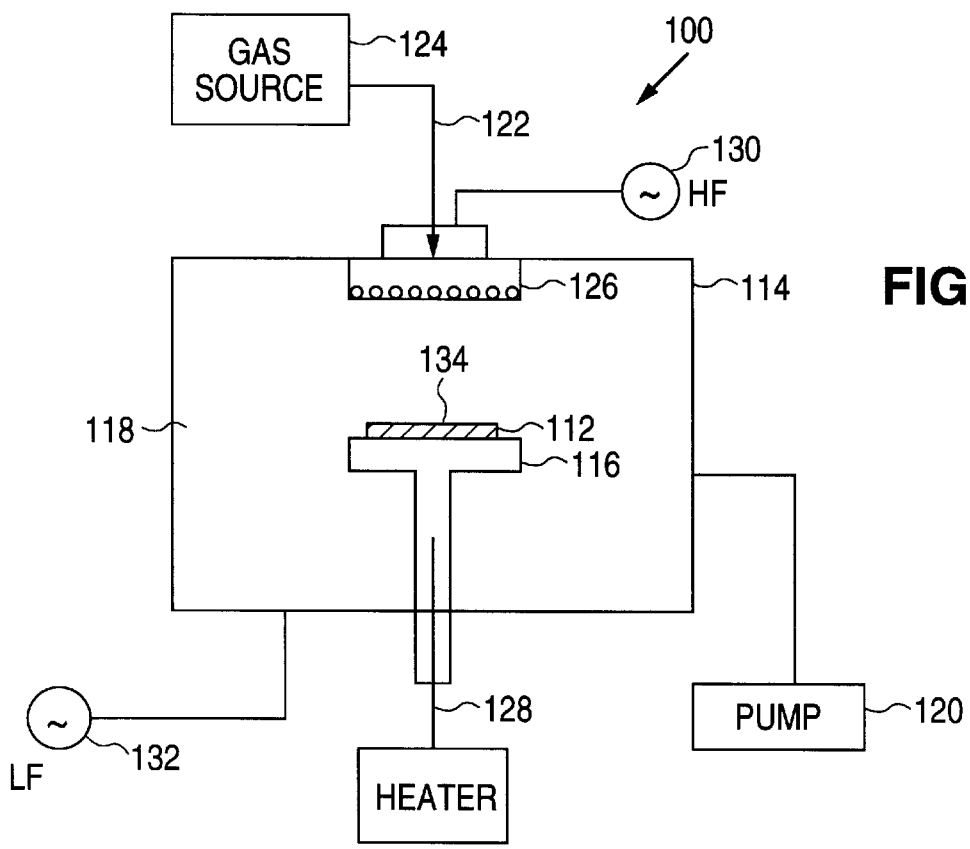
FIG. 3 is a simplified schematic illustration of a chemical vapor deposition device for use in the process of the present invention.

Referring now to FIG. 3, a schematic illustration is shown of a suitable CVD device 100 for providing a plasma enhanced chemical vapor deposition (PECVD) film on a substrate, such as substrate 112. Device 100 includes a PECVD chamber 114 of a size suitable for holding one or more substrates 112, which are supported in the chamber on a platform 116. Platform 116 can be heated to any desired temperature, the heating element for this purpose being schematically depicted as heating element 128. The heater and platform are used to select the temperature of wafer 112 during PECVD processing.

As is typical of such chambers, the interior 118 of chamber 114 can be evacuated or pressurized as desired by a suitable pump apparatus schematically illustrated in FIG. 3 by pump 120.

Selected gases used in PECVD processing are introduced into chamber 114 through a suitable manifold system 122 from various gas supply reservoirs 124. The gases are introduced into the chamber through what is called a showerhead 126, which distributes the gases as required.

Plasma energy is supplied to the chamber through an RF generator 130 which supplies high-frequency (HF) RF power. The industry standard for HF plasma energy used in PECVD chambers is 13.56 (MHz), although the invention is not limited to any exact high-frequency value. Chemical vapor deposition device 10 is preferably a dual frequency chamber which also provides a low-frequency (LF) generator 132 for Supplying LF power to the interior 118 of chamber 114. Low-frequency power is supplied between platform 116 and showerhead 126. The level of chemical stability in the FSG thin film is improved by deposition of the FSG thin film using RF low frequency power. One such dual frequency PECVD chamber is known as the Concept 2™, Sequel™ or Sequel Express™ reaction chamber manufactured by Novellus Systems, Inc.

Figure 4:
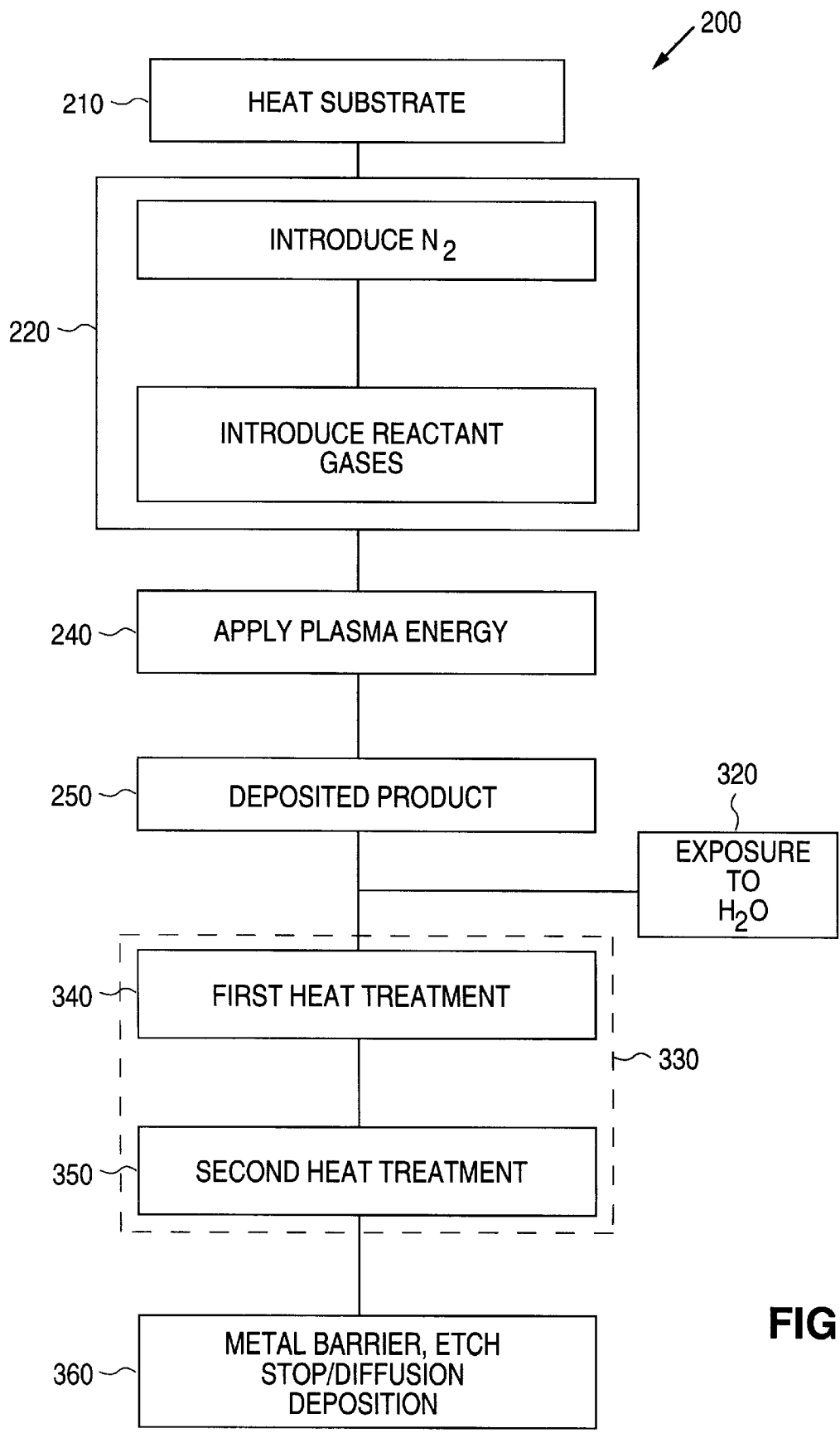
FIG. 4 is a flow diagram of a process of one embodiment of the present invention.

FIG. 4 illustrates a flow chart of one embodiment of process 200 of the present invention, which will be described with reference to both FIGS. 3 and 4. Substrate 112 is first positioned on platform 116 in PECVD chamber 114. Substrate 112 is typically a silicon wafer prepared for receiving an FSG film being deposited on the upper surface 134 of the substrate. In alternative embodiments, substrate 112 may be a silicon wafer having a metal barrier and/or etch stop layer of SiNx, Ta(N), TiN, WNx, or the like, thereon.

The first step 210 of process 200 includes the heating of substrate 112 to a temperature above 200° C. Preferably, wafer 112 is heated to a temperature generally in the range of between about 200° C. to about 500° C., for example 400° C.

Next, process 200 includes the introduction of a flow of reactant gases 220. In a preferred embodiment, the gases include a mixture of $N_2O$, $SiF_4$, $SiH_4$ and $N_2$ introduced into the interior 118 of chamber 114 via showerhead 126. Other combinations of gases may include, for example $NH_3$, as described below. The ratio of $N_2O$, $SiF_4$, $SiH_4$ and $N_2$ introduced into chamber 114 is selected to deposit an FSG thin film on substrate 112 by plasma enhanced vapor deposition having an abundance of nitrogen. The suggested $N_2$: $SiF_4$: $SiH_4$:$N_2O$ ratio is between 1.7:0.5:1:7 and 17:7:1:70, preferably, for example, 8:1:1:30. When the $N_2$:$SiF_4$ ratio is between about 17:1 to about 3:1, the resistance of the FSG film to $H_2O$ is improved. By way of example, $N_2$ flows into chamber 114 at a rate of about 500 sccm, to about 5000 sccm, preferably 2500 sccm. The remaining gas recipe may then be set at flow rates of approximately: $SiF_4$ about 100 sccm to about 1500 sccm, $SiH_4$ about 300 sccm, and $N_2O$ about 5000 sccm to about 25,000 sccm, to form the FSG film.

The deposition rate and the fluorine concentration of the FSG film are selectively controlled by the flow rates of the $N_2O$, $SiF_4$, $SiH_4$, and $N_2$ gases, the dual-frequency power, the chamber pressure, and the process temperature within chamber 114. As mentioned above the pressure inside chamber 114 may be controlled. In a preferred embodiment, the ambient pressure during the deposition may generally be maintained from about 0.1 Torr to about 5 Torr, preferably in the range of about 1 Torr to about 2.6 Torr, for example 2.1 Torr. Maintaining the pressure within these levels during the PECVD process improves the FSG film deposition rate.

As the gases enter chamber 114, suitable plasma power is applied. As mentioned above, chamber 114 may be a dual-frequency chamber providing both HF and LF power. In one embodiment, suitable plasma power includes HF energy (13.56 MHz) at an energy level preferably between about 0.5 watts per square cm and about 5 watts per square cm of substrate surface. The low-frequency RF power, generally in the range of between about 100 kHz to about 500 kHz, may have an energy level ranging from about 0.318 watts per square cm of substrate surface to about 3.18 watts per square cm of substrate surface. By using low-frequency power in the present embodiment, the level of film stress in the FSG thin film, may be maintained between about $0.1 \times 10^9$ dyne/$cm^2$ to about $2.5 \times 10^9$ Dyne/$cm^2$ compressive preferably, $1.0 \times 10^9$ Dyne/$cm^2$ compressive.

Figure 1:
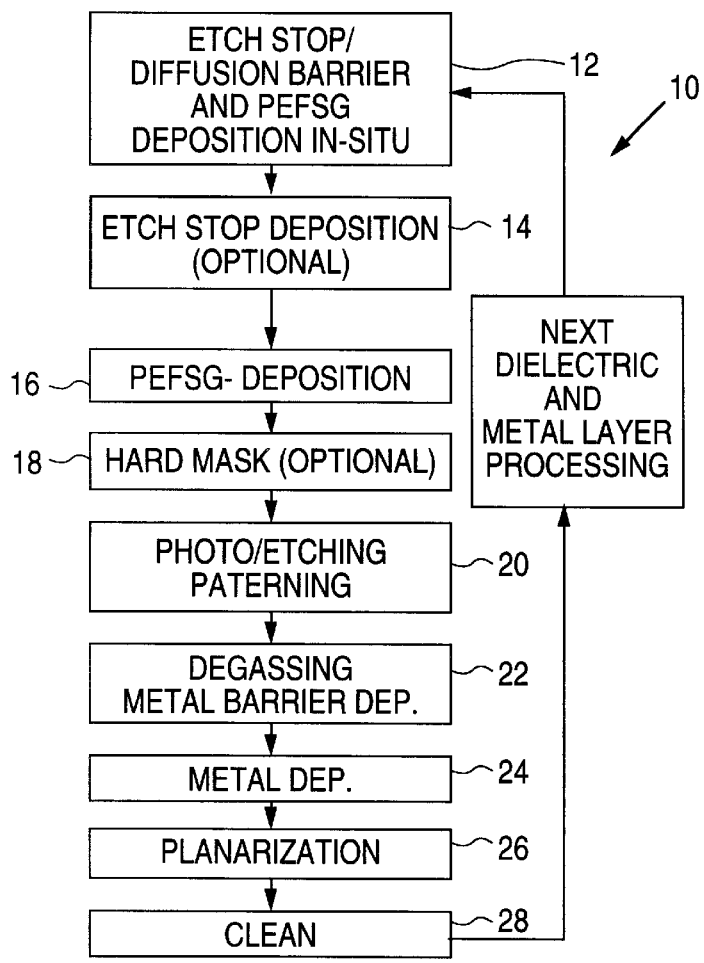
FIG. 1 illustrates a flow diagram of a typical damascene process.
Figure 2A:
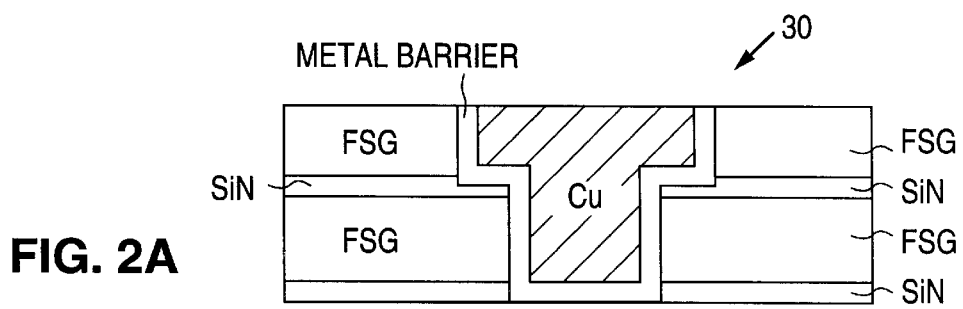
FIGS. 2A and 2B are simplified illustrations of cross-sections of resultant products of the deposition and patterning steps of the damascene process of FIG. 1.
Figure 2B:
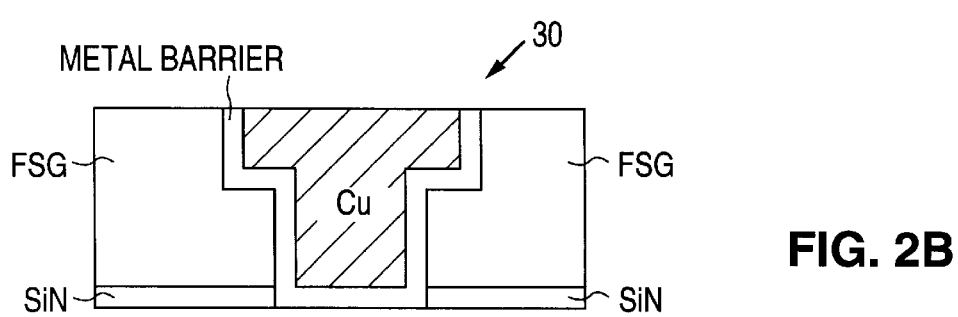

As is known to those skilled of in the art PECVD processing, the plasma energy in chamber 114 ionizes the introduced gases, generating radicals which are deposited on surface 134 of wafer 112 to arrive at the deposited product (step 250) in FIG. 4 illustrated in FIGS. 2A or 2B. The preferred reactant gases $N_2O$, $SiF_4$, $SiH_4$ and $N_2$ provide discharge of long-life radicals and ions, which include F, N, O, H, and Si. The ions form bonds with Si and/or Si—O within the film. With the exception of the Si—N bonds, the Si—O bonds are weak, which means that they are easily broken. In a preferred embodiment of the present invention, illustrated in FIG. 4, the FSG film is exposed to $H_2O$ (step 320), which may occur naturally by exposure to the atmosphere or purposely as by soaking in $H_2O$. The presence of $H_2O$ has been shown to break the weak bonds and generate dangling bonds when sufficient energy is supplied.

In another embodiment, following the exposure to $H_2O$, process 200 further includes the additional step 330 of annealing the deposited FSG film. The annealing is considered to be a one-step process; however, the annealing 330 is best described as providing two heat treatments to the FSG film.

The first heat treatment 340 is conducted in a non-oxidizing atmosphere, typically nitrogen, argon, and the like, to diffuse out free F, O, and H near the surface of the FSG film. First heat treatment 340 provides energy substantive enough to allow the reaction between $H_2O$ and the ionic bonds to break the ionic bonds, and allow the trapped free radicals to diffuse out from the film network usually in the form of H, $H_2$, $H_2O$, HF gas and others. The $H_2O$ and HF that remains in the film after etch stop or barrier metal layer deposition may cause blistering or peeling. Moreover, by removing the free radicals, the film network is opened up, which allows for film expansion. The film also becomes porous, which causes the refractive index (RI) to go down, and gives the film a lower dielectric constant. The first heat treatment 340 is performed at a temperature in the range of between about 350° C. to about 500° C., preferably about 400AC. The first heat treatment should last at least 30 seconds to about 60 minutes, preferably 1.5 minutes.

During the first heat treatment, the pressure inside of the annealing chamber is preferably maintained at between about 0.1 Torr and 5 Torr, preferably between about 1 and 3 Torr, for example, 2.4 Torr. The pressure levels may be maintained throughout the duration of the first heat treatment.

As shown in FIG. 4, the annealing process includes a second heat treatment 350. The second heat treatment step is usually conducted just prior to the deposition of the metal barrier or etch stop layer (step 360), when it is important to ensure that remaining free F is removed from the film. The second heat treatment thus helps to prevent the formation of HF gas from occurring after deposition of the barrier or etch stop layers. Another result of second heat treatment 350 is that beside the driving off of additional free F, the treatment provides bonding energy so that remaining free F radicals and ions may react with the open network and dangling bonds. In this way, the percentage of F in the FSG layer may be increased while the dielectric constant of the layer is decreased. Second heat treatment 350 may occur at a temperature in the range of between about 350° C. to about 500° C., preferably 400° C. The treatment occurs at these temperatures in a SiNx, Ta(N), TiN or WNx process atmosphere for at least 10 seconds to about 5 minutes, preferably 40 seconds.

Figure 5:
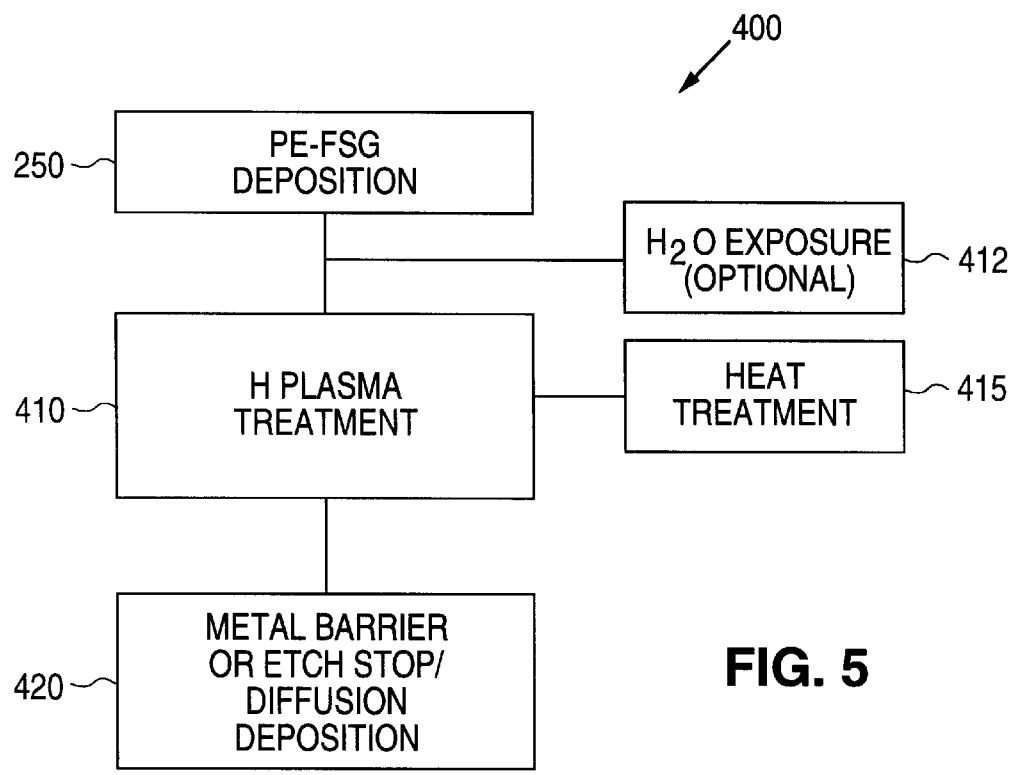
FIG. 5 is a flow diagram of a process of an alternative embodiment of the present invention.

Referring now to FIG. 5, a flowchart is shown of an alternative embodiment of the process of the present invention. After formation of the FSG film (step 250), as represented in FIGS. 2A and 2B, and after exposure to the atmosphere, the FSG film may be exposed to a hydrogen-related plasma (step 410 in FIG. 5), such as $H_2$ plasma or NH₃ plasma. The hydrogen plasma can capture free F and O ions from the surface of the FSG film to form $H_2O$ and HF to drive off the undesired free F and O ions before application of the barrier or etch stop layers (step 420). The hydrogen plasma may be generated from PECVD, HDP, or other plasma generating system. Optionally, the hydrogen plasma treatment may be combined with an anneal process 415. The anneal facilitates the removal of free F ions from the body of the substrate. The anneal 415 occurs in the temperature range of between about 350° C. to about 450° C., preferably 400° C. The anneal may have a time duration of at least 30 seconds to about 5 minutes, preferably I minute.

The following are specific experimental examples of the improved process of the present invention. These examples are for illustrative purposes only and are not meant to limit the invention.

EXAMPLE 1

A Novellus Systems, Inc. PECVD reactor Sequel System™ was used for depositing an FSG film on an SiN film. The objective of the experiment was to evaluate an FSG film during annealing, where the FSG film was formed with the addition of $N_2$ to the process of depositing the FSG film by PECVD. The $N_2$ addition has been found to improve film uniformity, increase deposition rates, and improve adhesion between the deposited FSG and SiN.

The Sequel System used an RF generator for an LF RF power supply of 250 kHz and an HF RF power supply of 13-5 MHz. $SiH_4$ and $N_2O$ gas flow rate, HF-RF and LF-RF power and temperature were kept constant (See Table 1). The $N_2$ flows were varied from 0 to 5000 sccm. The Station Deposition Times (SDTs) were set to 23.2 seconds for each test. The film-peeling test was conducted by adopting Novellus Standard methods including the following process sequence:

1) Deposit 12 KA FSG
2) Vacuum Break for 7 days or more
3) Cap with 5000 SiN

The film annealing tests were conducted at a temperature of 400° C. The $N_2$ flow was equal to 2000 sccm at a pressure of 2.4 Torr. Each wafer was annealed for 180 minutes.

Table 1 summarizes data and results. As shown, increasing $N_2$ flow increased the deposition rate and improved non-uniformity in the film. However, the percentage of Si-F was diluted. One test film produced using an $N_2$ flow rate equal to 2000 sccm was measured by a mercury probe to determine dielectric constant. The results showed no loss in the dielectric constant. A small effect on film stress was also observed. The $N_2$ addition also improved the FSG film adhesion to SiN. No blistering was observed when $N_2$ flow was set to more than 1500 sccm for 3 hours of annealing.

TABLE 1

| SLOTS: | SDT (sec) | N₂ sccm | LF watt | HF watt | Pres Torr | Thicks Å | % Uni | Stress e9 Dyne/cm² | R.I. | Dep. R. Å/min | Si-F% |
|---|---|---|---|---|---|---|---|---|---|---|---|
| SL1 | 23.2 | 0 | 1100 | 1000 | 2.1 | 11705 | 1.96 | −1.1103 | 1.426 | 4644.0 | 2.28 |
| SL2 | 23.2 | 0 | 1100 | 1000 | 2.1 | | | | | | |
| SL3 | 23.2 | 800 | 1100 | 1000 | 2.1 | 11306 | 1.5 | −11849 | 1.428 | 4873.0 | 2.16 |
| SL4 | 23.2 | 800 | 1100 | 1000 | 2.1 | | | | | | |
| SL5 | 23.2 | 1500 | 1100 | 1000 | 2.1 | 11505 | 1.15 | −1218 | 1.431 | 4959.0 | 2.06 |
| SL6 | 23.2 | 1500 | 1100 | 1000 | 2.1 | | | | | | |
| SL7 | 23.2 | 2500 | 1100 | 1000 | 2.1 | 12561 | 1.09 | −1302 | 1.439 | 4983.0 | 1.92 |
| SL8 | 23.2 | 2500 | 1100 | 1000 | 2.1 | | | | | | |
| SL9 | 23.2 | 5000 | 1100 | 1000 | 2.1 | 12107 | 0.782 | −1.451 | 1.439 | 5218.0 | 1.75 |
| SL10 | 23.2 | 5000 | 1100 | 1000 | 2.1 | | | | | | |

EXAMPLE 2

To understand the thermal treatment effect on PECVD FSG thermal stability, 12 kÅ PECVD FSG films were deposited using a Sequel System™ reactor and humidified in an atmosphere from 6 to 124 days. Before and after thermal treatment Fourier Transform Infrared Spectroscopy (FTIR) absorption spectra were measured using a double-beam spectrometer ranging from 500 to 4000 $cm^{-1}$, focusing on the OH (3200–3700 $cm^{-1}$) and SiF (900–950 $cm^{-1}$) bands. Samples for measuring dielectric constant were prepared including an as-deposited sample and a sample after 60 min of annealing which was capped with a thin SiN film to block water absorption. The condition was set to anneal at temperatures of 350° C. to 425° C., at 2.4 Torr pressure and $N_2$ ambient.

Film Stress Change

The stress aging over time is a good indication of the film stability. An increase in LF RF power can make the film more compressive, because the ion bombardment can force the insertion of the ions and radicals into the film network, which causes compressive stress in the as-deposited films. On the other hand, moisture absorption makes a weak bond between $H_2O$ to F or OH which allows HF to form. This also makes the film more compressive (See Tables 4 and 5). The results of this experiment indicate that the thermal treatment not only can remove the radicals trapped in the as-deposited films, but can also break the weak-bonded $H_2O$ in the aged FSG films. This results in film expansion, which makes the film less compressive. The film stress after thermal treatment, tends to be a constant ($-0.5 \times 10^9$ dyne/cm2), which indicates that the film has become stable.

Refractive Index and Dielectric Constant

Other significant changes occur in the refractive index (RI) and dielectric constant after thermal treatment. The film refractive index and dielectric constant change over time when the film is exposed to the atmosphere (e.g., $H_2O$), and after the thermal treatment (See Tables 3 and 5). The RI and dielectric constant decrease may also be attributed to the outgassing of the draped radicals and to film expansion.

FTIR

The percentage of Si-F/SiO increases after thermal treatment. Table 2 shows the film property change after three different temperature treatments. Thermal treatment provides extra bonding energy for free F re-bonding into film network, which results in a higher percentage of Si—F/Si—O in the film.

PECVD FSG can have very significant film property changes after thermal treatment. Due to film outgassing of the draped radicals and film expansion, the film becomes a less compressive (from ~−1.2250 to ~−0.4550 $10^9$ dyne/$cm^2$). The RI and dielectric constant are lower (RI: from ~1.4300 to ~1.4256, dielectric constant: from ~3.60 to ~3.59). Also, the PECVD FSG tends to be more stable after thermal treatment. For films exposed over 124 days to the atmosphere, the stress levels and RI remained almost unchanged (Stress: ~0.6410 $10^9$ dyne/$cm^2$, RI: 1.4332) for these thermal treatment levels.

These experimental results show that the thermal treatment is a beneficial step in making an FSG film which is stable for Cu-Damascene application.

Moreover, it was found that in a PECVD FSG film, exposed to the atmosphere for more than 7 days following a thermal treatment, the total H content of the SiN film is not a concern.

Conclusions (1) Thermal treatment used prior to SiN deposition made the stressless and decreased the RI significantly after 7 days ETA.

(2) Dielectric constant was not affected by ETA and thermal treatment.

(3) No obvious fluorine loss was observed after 7 days ETA and thermal treatment.

TABLE 2

| Temp °C. | Time Mins | Thicks Å As-Dep. | Thicks Å 15 Days | Thicks Å After Bake | Thicks Å Delta | RI 15 Days | RI After Bake | RI Delta | % F Pre | % F Post | % F Delta |
|---|---|---|---|---|---|---|---|---|---|---|---|
| 350 | 5 | 11824 | 11889 | 11867 | −22 | 1.4304 | 1.4265 | −0.0039 | 230 | 2.25 | −0.05 |
| 350 | 30 | 11790 | 11851 | 11836 | −15 | 1.4299 | 1.4260 | −0.0039 | 2.27 | 2.32 | 0.05 |
| 350 | 60 | 11788 | 11849 | 11830 | −19 | 1.4306 | 1.4262 | −0.0044 | 2.27 | 2.31 | 0.04 |
| 400 | 5 | 11666 | 11695 | 11705 | −10 | 1.4288 | 1.4267 | −0.0021 | 2.25 | 2.29 | 0.04 |
| 400 | 30 | 11434 | 11476 | 11467 | −9 | 1.4289 | 1.4259 | −0.0030 | 2.29 | 2.38 | 0.09 |
| 400 | 60 | 11428 | 11468 | 11458 | −10 | 1.4292 | 1.4271 | −0.0021 | 2.32 | 2.36 | 0.04 |
|  |  | As-Dep | 6 days |  |  | 6 days |  |  |  |  |  |
| 425 | 5 | 11819 | 11880 | 11890 | 10 | 1.4308 | 1.4259 | −0.0049 | 2.29 | 2.30 | 0.01 |
| 425 | 30 | 11797 | 11852 | 11860 | 8 | 1.4298 | 1.4263 | −0.0035 | 2.28 | 2.31 | 0.03 |
| 425 | 60 | 11795 | 11850 | 11856 | 6 | 1.4300 | 1.4262 | −0.0038 | 2.28 | 2.28 | 0.00 |

TABLE 3

| Wafer ID | Tox (cm) | Cor Fac | Tcor (cm) | Tnit (cm) | Ttot (cm) | Kn | Ceq | Probe Size ($cm^2$) | Eo (F/cm) | Keq | Kox | Comments |
|---|---|---|---|---|---|---|---|---|---|---|---|---|
| SPC4 | 4.46 E-05 | 1.0271 | 4.58 E-05 | 9.44 E-06 | 5.52 E-05 | 6.39 | 8.48 E-11 | 1.363 E-02 | 8.85 E-14 | 3.88 | 3.59 | no bake w/SiN cap |
| SPE4 | 4.46 E-05 | 1.0256 | 4.57 E-05 | 9.44 E-06 | 5.51 E-05 | 6.39 | 8.45 E-11 | 1.363 E-02 | 8.85 E-14 | 3.86 | 3.57 | ETA of 9 days then baked 60 mins w/SiN cap |

TABLE 4

| Tox (Å) As-Dep | RI As-Dep | Stress e9 D/$cm^2$ As-Dep | ETA days | Tox (Å) Pre bake | RI Pre bake | Stress e9 D/$cm^2$ Pre bake | Tox (Å) 7 day Delta | RI 7 day Delta | Stress e9 D/$cm^2$ 7 day Delta |
|---|---|---|---|---|---|---|---|---|---|
| 11549 | 1.4283 | −1.2130 | 7 | 11575 | 1.4298 | −1.3380 | 26 | 0.0015 | −0.1250 |
| 11539 | 1.4289 | −1.2190 | 7 | 11565 | 1.4299 | −1.3360 | 26 | 0.0010 | −0.1270 |
| 11524 | 1.4289 | −1.2210 | 7 | 11550 | 1.4297 | −1.3420 | 26 | 0.0007 | −0.1210 |
| 11578 | 1.4284 | −1.1930 | 7 | 11605 | 1.4294 | −1.3180 | 27 | 0.0010 | −0.1250 |
| 11607 | 1.4285 | −1.1980 | 7 | 11634 | 1.4297 | −1.3290 | 27 | 0.0012 | −0.1310 |
| 11595 | 1.4289 | −1.1940 | 7 | 11622 | 1.4295 | −1.3200 | 27 | 0.0006 | −0.1260 |
| 11535 | 1.4289 | −1.2250 | 7 | 11559 | 1.4301 | −1.3430 | 24 | 0.0012 | −0.1180 |
| 11579 | 1.4287 | −1.1820 | 7 | 11559 | 1.4299 | −1.3190 | 28 | 0.0012 | −0.1370 |
| 11543 | 1.4285 | −1.2260 | 7 | 11568 | 1.4302 | −1.3510 | 25 | 0.0017 | −0.1250 |

| Temp Time °C. | Bake Time min | Tox Å Post | RI Post bake | Stress e9 D/$cm^2$ Post bake | Delta Tox Post - Pre | Delta RI Post - Pre | Delta RI Post- As Dep | Delta Stress Post - Pre | Delta Stress Post- As Dep | SiN Soak Sec. | Cap Layer Anneal 400° C. | Peeling[2] Results % Area |
|---|---|---|---|---|---|---|---|---|---|---|---|---|
| 350 | 1 | 11568 | 1.4293 | −0.4766 | 19 | −0.0005 | 0.0010 | 0.7364 | 0.7640 | 10 | 3 Stacks[1] | 0% |
| 350 | 2 | 11556 | 1.4286 | −0.4227 | 17 | −0.0013 | −0.0003 | 0.7963 | 0.7963 | 10 | 3 Stacks | 0% |

TABLE 4-continued

| | | | | | | | | | | | | |
|---|---|---|---|---|---|---|---|---|---|---|---|---|
| 350 | 3 | 11536 | 1.4289 | −0.4901 | 12 | −0.0008 | 0.0000 | 0.7309 | 0.7309 | 10 | 3 Stacks | 0% |
| 375 | 1 | 11592 | 1.4284 | −0.4591 | 14 | −0.0010 | 0.0000 | 0.8243 | 0.7339 | 10 | 3 Stacks | 0% |
| 375 | 2 | 11617 | 1.4286 | −0.4937 | 10 | −0.0011 | 0.0001 | 0.8296 | 0.7043 | 10 | 3 Stacks | 0% |
| 375 | 3 | 11603 | 1.4287 | −0.4994 | 8 | −0.0008 | −0.0002 | 0.8206 | 0.6946 | 10 | 3 Stacks | 0% |
| 400 | 1 | 14284 | 1.4284 | −0.5280 | 11 | −0.0017 | −0.0005 | 0.6970 | 0.6970 | 10 | 3 Stacks | 0% |
| 400 | 2 | 14283 | 1.4283 | −0.5100 | 10 | −0.0016 | −0.0004 | 0.6720 | 0.6720 | 10 | 3 Stacks | 0% |
| 400 | 3 | 14280 | 1.4280 | −0.5528 | 10 | −0.0022 | −0.0005 | 0.6732 | 0.6732 | 10 | 3 Stacks | 0% |
| 400 | 5 | 5 | | | | | | | | 10 | 3 Stacks | 0% |

Note: [(1)] 3 stacks: SIN/USG/SIN [(2)] Peeling Test. 3 Hrs, 400° C., 2.4 Torr, $N_2$

TABLE 5

| Hours Time | e9 D/cm² Stress | RI | (Å) Tox | % Si—F/SiO | Remark |
|---|---|---|---|---|---|
| 0 | −1.2040 | 1.4295 | 11795 | 2.19 | As-Dep. |
| 0.5 | −1.2100 | 1.4296 | | | |
| 1 | −1.2130 | 1.4303 | | | |
| 2 | −1.2220 | 1.4305 | | | |
| 3 | −1.2390 | 1.4304 | | | |
| 9.5 | | 1.4307 | | | |
| 14 | | 1.4310 | | 2.13 | |
| 19.3 | | 1.4312 | | 2.10 | |
| 34 | | 1.4311 | | | |
| 65 | −1.2180 | 1.4318 | | | |
| 137 | −1.2640 | 1.4334 | | | |
| 139 | −0.5056 | 1.4286 | 11813 | 2.14 | After Anneal |

TABLE 5-continued

| Hours Time | e9 D/cm² Stress | RI | (Å) Tox | % Si—F/SiO | Remark |
|---|---|---|---|---|---|
| 161 | −0.5253 | 1.4279 | | | After Anneal |
| 233 | −0.5387 | 1.4293 | | 2.26 | After Anneal |
| 720 | −0.6199 | 1.4320 | | | After Anneal |
| 840 | −0.6055 | 1.4330 | | 2.20 | After Anneal |
| 2976 | −0.6410 | 1.4332 | | | After Anneal |

TABLE 6

| Process Parameter | Settings |
|---|---|
| $SiH_4$ | 300 |
| $N_2$ | 2000 |
| $N_2O$ | 12000 |
| Temperature | 400 |
| $SiF_4$ | 900 |
| Pressure (Torr) | 2.1 |
| LF RF Power | 1100 |
| HF RF Power | 1000 |

EXAMPLE 3

Experiments on PECVD FSG of the recipe settings described in Table 6, were performed. Although water absorption is a basic characteristic of FSG film, a pretreatment may be used to drive off the moisture from the FSG film. This experiment included: a) heating of the wafer to a temperature of up to 400° C. for 5 minutes in a High Density Plasma (HDP) system of hydrogen before HDP SiN deposition; and b) 38.5 seconds of wafer heating time with hydrogen plasma before HDP SiN deposition.

The FSG film was exposed to the atmosphere for 11 days. Both the HDP hydrogen plasma treatment showed no blistering visually observed (Table 7). This may be attributed to the hydrogen plasma reacting with free F, which had diffused from the FSG, to form HF, which was then pumped away from the gas phase during the 38.5 second heat-up time.

TABLE 7

| FSG | ETA days | HDP $H_2$ Plasma (min) | HDP $H_2$ Plasma heat up (sec) | SIN/USG/SIN | Annealing (min) | Results blistering |
|---|---|---|---|---|---|---|
| 12KÅ | 11 | 5 | 38.5 | yes | 180 | clean |
| 12KÅ | 11 | 5 | 38.5 | yes | 180 | clean |
| 12KÅ | 11 | 0 | 38.5 | yes | 180 | clean |
| 12KÅ | 11 | 0 | 38.5 | yes | 180 | clean |

EXAMPLE 4

Experiments on PECVD FSG of the recipe settings described in Table 6, were performed. The FSG film was exposed to atmosphere for 12 days. Prior SiN deposition, $NH_3$ plasma treatment was conducted with different treatment times. Table 8 shows the experiment set-up and test results.

TABLE 8

| FSG | ETA days | $NH_3$ Plasma (sec.) | SIN/USG/SIN (Å) | Annealing (min) | Results blistering |
|---|---|---|---|---|---|
| 12KÅ | 12 | 10 | yes | 180 | clean |
| 12KÅ | 12 | 30 | yes | 180 | clean |
| 12KÅ | 12 | 60 | yes | 180 | clean |

What is claimed is:

1. A process for depositing a dielectric material on a substrate, the process comprising:
   reacting vapor-phase chemicals in a chamber with sufficiently supplied energy to deposit a fluoro silicate glass (FSG) thin film layer on a substrate positioned in the chamber;
   exposing said FSG thin film layer to water; and
   annealing the FSG thin film layer for a time and at a temperature sufficient to allow said water to react with said FSG thin film layer to diffuse out a chemical element from the thin film layer.

2. A process as in claim 1, wherein the vapor-phase chemicals are a mixture $N_2$ and at least one chemical taken from the group consisting of $N_2O$, $SiF_4$, and $SiH_4$.

3. A process as in claim 1, further comprising annealing the FSG thin film layer for a time and at a temperature sufficient to provide a bonding energy within the film layer.

4. A process as in claim 1, wherein the chamber is maintained at a chamber pressure of between about 0.1 Torr and about 5 Torr.

5. A process as in claim 1, wherein the sufficient supplied energy comprises an RF low frequency power energy level of between about 0.318 watts/cm$^2$ to about 3.18 watts/cm$^2$.

6. A process as in claim 1, wherein the FSG thin film layer comprises a dielectric constant of between about 3.4 and about 3.9.

7. A process as in claim 1, wherein the FSG thin film layer experiences a thin film stress of between about $-0.1 \times 10^9$ dyne/cm$^2$ to about $-2.5 \times 10^9$ dyne/cm$^2$.

8. A process as in claim 1, wherein the substrate comprises a metal barrier layer of a material selected from the group consisting of SiN, Ta(N), Ti, and WNx.

9. A process as in claim 1, wherein the substrate comprises an etch stop layer of a material selected from the group consisting of SiN, Ta(N), Ti, and WNx.

10. A process as in claim 1, wherein the annealing comprises a first heat treatment having a duration of time in the range of between a 0.5 minute to 2 hours at an annealing temperature in the range of between about 350° C. to 500° C. and a second heat treatment having a duration of time in the range of between 10 seconds to 5 minutes at an annealing temperature in the range of between 250° C. to 425° C.

11. A process as in claim 1, wherein the annealing comprises two heat treatments, a first heat treatment having a duration of 1.5 mins at an annealing temperature of 400° C. and a second heat treatment having a duration of 40 seconds at an annealing temperature of 400° C.

12. A process claim as in claim 1, further comprising removing the diffused out element from the chamber.

13. A process for forming a low dielectric constant fluoro silicate glass (FSG) material with improved characteristics on a substrate to form an FSG thin film layer, the process comprising:

exposing the FSG thin film layer to water;

heat treating the FSG thin film layer in the presence of a non-oxidizing atmosphere at a first temperature for a first time duration, the first temperature and first time duration sufficient to diffuse out at least one element from the FSG thin film layer; and heat treating the FSG thin film layer in the presence of a process atmosphere at a second temperature for a second time duration for providing a bonding energy to the FSG thin film layer.

14. A process as in claim 13, wherein the non-oxidizing atmosphere is taken from the group consisting of nitrogen and argon.

15. A process as in claim 13, wherein the non-oxidizing atmosphere is maintained at a pressure of between about 0.1 Torr and about 5 Torr.

16. A process as in claim 13, wherein the process atmosphere is maintained at a pressure of between about 0.1 Torr and about 5 Torr.

17. A process as in claim 13, wherein the FSG thin film layer comprises an $N_2O$, $N_2$, $SiF_4$ and $SiH_4$ based FSG.

18. A process as in claim 13, wherein the FSG thin film layer is a dielectric material with a dielectric constant of between about 3.4 and about 3.9.

19. A process as in claim 13, wherein the FSG thin film layer can experience a thin film stress of between about $-0.1 \times 10^9$ dye/cm$^2$ to about $-2.5 \times 10^9$ dyne/cm$^2$.

20. A process as in claim 13, wherein the substrate comprises a metal barrier layer.

21. A process as in claim 13, wherein the substrate comprises a etch stop layer comprising a material selected from the group consisting of SiN, Ta(N), Ti, and WNx.

22. A process as in claim 13, wherein the first time duration is in the range of between 30 seconds to about 60 minutes.

23. A process as in claim 13, wherein the second time duration is in the range of between 10 seconds to about 5 minutes.

24. A process as in claim 13, wherein the first heating temperature is in the range of between 350° C. to 500° C.

25. A process as in claim 13, wherein the second heating temperature is in the range of between 250° C. to 425° C.

26. A process as in claim 13, wherein the chemical element is a free radical taken from the group consisting of fluorine and hydrogen.

27. A process claim as in claim 13, further comprising removing the diffused out element from the chamber.

28. A process as in claim 13, wherein the process atmosphere comprises a an atmosphere suited for processing substrates comprising a material taken from the group consisting of SiNx, Ta(N), Ti, and WNx.

29. A process for depositing a dielectric material on a substrate, the process comprising:

reacting vapor-phase chemicals in a chamber with sufficiently supplied energy to deposit a thin film layer of fluorosilicate glass (FSG) on a substrate positioned in the chamber;

exposing said thin film layer of FSG to water;

treating said thin film layer of FSG in a hydrogen rich plasma environment; and annealing said thin film layer of FSG for a time and at a temperature sufficient to allow said water to react with said thin film layer to diffuse out a chemical element from the thin film layer.

30. The method of claim 29, wherein said hydrogen rich plasma environment comprises $NH_3$ or $H_2$.

31. A process as in claim 29, wherein the annealing comprises a heat treatment having a duration of time in the range of between about 30 seconds to 5 minutes at an annealing temperature in the range of between about 350° C. to 450° C.

* * * * *